United States Patent [19]

Honig

[11] Patent Number: 4,642,476
[45] Date of Patent: Feb. 10, 1987

[54] REVERSING-COUNTERPULSE REPETITIVE-PULSE INDUCTIVE STORAGE CIRCUIT

[75] Inventor: Emanuel M. Honig, Los Alamos, N. Mex.

[73] Assignee: The United States of America as represented by the United States Department of Energy, Washington, D.C.

[21] Appl. No.: 617,653

[22] Filed: Jun. 5, 1984

[51] Int. Cl.[4] .............................................. H03K 3/00
[52] U.S. Cl. .................................... 307/108; 307/106; 363/138; 89/8; 124/3
[58] Field of Search .................. 307/106, 108, 104; 372/25, 38; 363/54, 138, 124; 89/8; 124/3

[56] References Cited

U.S. PATENT DOCUMENTS

| | | | |
|---|---|---|---|
| 3,390,305 | 6/1968 | Greenwood | 361/4 |
| 3,766,492 | 10/1973 | Rosati | 372/38 |
| 3,849,670 | 11/1974 | Lourigan | 307/108 |
| 3,963,945 | 6/1976 | Colyn | 388/67 X |
| 4,406,952 | 9/1983 | Molen et al. | 328/67 X |
| 4,473,875 | 9/1984 | Parsons et al. | 363/124 |

FOREIGN PATENT DOCUMENTS 97370  6/1982  Japan ................................... 363/124

OTHER PUBLICATIONS

"Economics of Multimillion-Joule Inductive Energy Storage", by Early and Walker, Trans. AIEE Port I, vol. 76, 7-1957, pp. 320-325.
"Energy Storage for Thermonuclear Research", by Carruthers, Proc. IEE, vol. 106, Part A, Suppl. No. 2, 4-1959, pp. 166-172.
"The Storage and Transfer of Energy", by Carruthers, Proc. Int. Conf. on High Magnetic Fields, Cambridge, MA, Nov. 1-4, 1961.
"Investigations on Switching Schemes for Inductive Energy Storage Systems", Proc. 5th Symp. on Fusion Tech., Oxford, England, Jul. 2-5, 1968.
"Theory and Application of the Commutation Principle for HUDC C.B.", by Greenwood and Lee, IEEE Trans. Power Apparatus, vol. DA5-91, Jul. 1972.
"An Inductive Energy Storage System Using Ignition Switching", by Simon and Bronner, IEEE Trans. Nuclear Science, vol. 14, No. 3, 8-1967.
"Inductive Energy Transfer Using a Flying Capacitor", by Dick and Dustmann, Proc. Int. Conf. Energy Storage, 11-1974.
"A Repetitive Current Interrupter for an Inductive Energy Storage Circuit", by Bauer, Barber and Clark, Proc. IEEE Pulsed Power Conf. 6-1983.

Primary Examiner—A. D. Pellinen
Assistant Examiner—Derek S. Jennings
Attorney, Agent, or Firm—Leonard C. Brenner; Paul D. Gaetjens; Judson R. Hightower

[57] ABSTRACT

A high-power reversing-counterpulse repetitive-pulse inductive storage and transfer circuit includes an opening switch, a main energy storage coil, a counterpulse capacitor and a small inductor. After counterpulsing the opening switch off, the counterpulse capacitor is recharged by the main energy storage coil before the load pulse is initiated. This gives the counterpulse capacitor sufficient energy for the next counterpulse operation, although the polarity of the capacitor's voltage must be reversed before that can occur. By using a current-zero switch as the counterpulse start switch, the capacitor is disconnected from the circuit (with a full charge) when the load pulse is initiated, preventing the capacitor from depleting its energy store by discharging through the load. After the load pulse is terminated by reclosing the main opening switch, the polarity of the counterpulse capacitor voltage is reversed by discharging the capacitor through a small inductor and interrupting the discharge current oscillation at zero current and peak reversed voltage. The circuit enables high-power, high-repetition-rate operation with reusable switches and features total control (pulse-to-pulse) over output pulse initiation, duration, repetition rate, and, to some extent, risetime.

8 Claims, 10 Drawing Figures

REVERSING-COUNTERPULSE REPETITIVE-PULSE INDUCTIVE STORAGE CIRCUIT

This invention is the result of a contract with the Department of Energy (Contract No. W-7405-ENG-36).

BACKGROUND OF THE PRESENT INVENTION

The present invention relates generally to a high-power pulsing circuit and more particularly to a repetitive-pulse inductive energy storage and transfer circuit.

Many applications requiring power in the form of a train of high-power pulses are emerging from major programs within the Department of Energy and Department of Defense communities. Included among these applications are high-repetition-rate particle accelerators and lasers, pulsed microwave generators, high-power high-resolution radar, and induction heating systems. When the pulse-train duty factor (pulse width/pulse interval) is low, energy storage capability is needed to provide proper power conditioning. Inductive energy storage is attractive for these systems because it has both a high energy storage density and a fast discharge capability. However, to transfer energy from a coil or inductor to a load, an opening switch must be used to interrupt the current and insert the load into the circuit. The opening switch must carry the large coil current during the storage time, interrupt the current, and then withstand the high voltage generated by the coil current flowing through the load. The opening switch problem is difficult enough for single-shot operation, but it becomes almost impossible when repetitive operation is required.

Two types of repetitive-pulse operation of inductive storage systems have appeared in the literature. The first uses a rotary, mechanical opening switch to generate pulses at moderate power levels and repetition rates (about 1 MW and 60 pulses per second (pps), respectively) with a low impedance load, see D. Bauer and J. Barber, "A Repetitive Current Interrupter for an Inductive Energy Storage Circuit," Proc. 4th IEEE Pulsed Power Conf., Albuquerque, N.M., June 6-8, 1983, IEEE Pub. No. 83CH1908-3, pp. 98-101. Due to its mechanical construction and nature of operation (sliding brushes), the rotary switch has essentially no potential for meeting the high-power, high-repetition-rate pulse requirements of the DOE and DoD applications discussed earlier.

The second uses an explosive opening switch and a string of fuses to produce a train of 3-5 pulses at a peak power level of 2.6 GW and a pulse repetition rate of about 50 kpps, see R. D. Ford and I. M. Vitkovitsky, "Inductive Storage Pulse-Train Generator," Proc. 13th Pulse Power Modulator Symp., Buffalo N.Y., June 20-22, 1978, IEEE Pub. No. 78CH1371-4-ED, pp. 284-288. The need to replace the explosive opening switch and fuses between each burst of pulses severely restricts the use of this method, limiting it primarily to the research laboratory.

Therefore, it is an object of the present invention to provide a high-power repetitive-pulse inductive energy storage and transfer circuit.

It is another object of the present invention to provide an efficient high-power inductive energy transfer circuit having a reusable opening switch.

It is another object of the present invention to provide a repetitive-pulse inductive energy storage and transfer circuit having complete control (pulse-to-pulse) over output pulse initiation and repetition rate, pulse duration, and, to some extent, pulse risetime.

It is still another object of the present invention to provide a reversing-counterpulse repetitive-pulse inductive storage and transfer circuit which can provide a repetitive counterpulse to the main opening switch without using a bridge arrangement for the counterpulse capacitor.

SUMMARY OF THE INVENTION

To achieve the foregoing and other objects, and in accordance with the purpose of the present invention, as embodied and broadly described herein, the repetitive high-power pulse circuit of the present invention includes an opening switch, a main energy storage coil, a counterpulse capacitor, and a small inductor. After counterpulsing the opening switch off, the counterpulse capacitor is recharged by the main energy storage coil before the load pulse is initiated. This gives the counterpulse capacitor sufficient energy for the next counterpulse operation, although the polarity of the capacitor's voltage must be reversed before that can occur. By using a current-zero switch as the counterpulse start switch, the capacitor is disconnected from the circuit (with a full charge) when the load pulse is initiated, preventing the capacitor from depleting its energy store by discharging through the load. After the load pulse is terminated by reclosing the main opening switch, the polarity of the counterpulse capacitor voltage is reversed by discharging the capacitor through a small inductor and interrupting the discharge current oscillation at zero current and peak reversed voltage.

An advantage of the present invention is that it uses inductive energy storage having both a high energy storage density and a fast discharge capability in a high-power repetitive-pulse circuit.

Another advantage of the present invention is that it enables repetitive counterpulse operation without using a bridge arrangement, thereby eliminating the need for two switches and resulting in significant cost savings and some size reduction of inductive storage systems for large-scale repetitive-pulse applications.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE PREFERRED EMBODIMENT

Figure 1:
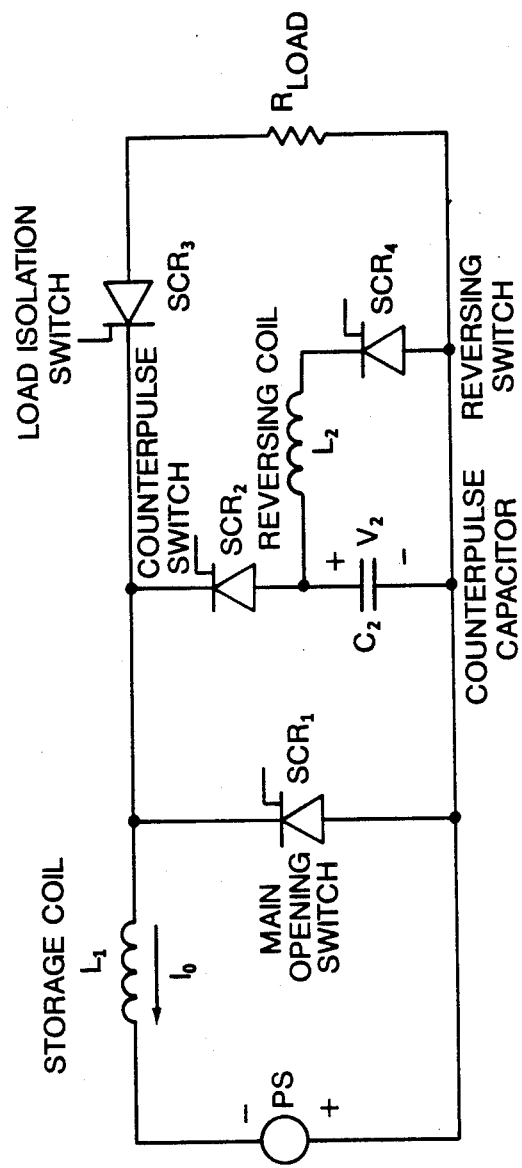
FIG. 1, is a circuit diagram of an embodiment of the present invention using solid-state SCR switches.

An embodiment of the present invention using solid-state SCR switches is shown in FIG. 1. The power level attainable depends upon the ratings of the specific SCR switches used. The power supply PS charges the storage coil $L_1$, to a current level $I_0$ through the closed main opening switch $SCR_1$. An external power supply (not shown) charges the counterpulse capacitor $C_2$ to a voltage level $V_2$. The transfer cycle is initiated by closing counterpulse switch $SCR_2$ to allow $C_2$ to discharge rapidly through the main opening switch $SCR_1$ (in the direction opposing the storage coil current flow). When the current in the main opening switch $SCR_1$ reaches zero and attempts to reverse polarity, the main opening switch $SCR_1$ opens. The storage coil current is then diverted into the counterpulse capacitor $C_2$, where it acts to reverse the voltage polarity and recharge it for the next counterpulse operation. When the counterpulse capacitor $C_2$ has been recharged, the load isolation switch $SCR_3$ is closed to initiate the output pulse through load $R_{LOAD}$.

The load pulse has a rapid risetime, limited by the stray inductance in the discharge loop as counterpulse capacitor $C_2$ attempts to discharge through the load $R_{LOAD}$. When the load current reaches the level of current still flowing through the storage coil $L_1$, the counterpulse switch $SCR_2$ sees a current zero and opens, removing the counterpulse capacitor $C_2$ from the circuit until needed for the next counterpulse operation. The storage coil current then flows directly through the load $R_{LOAD}$ until the load pulse is terminated by reclosing the main opening switch $SCR_1$. After the load pulse and while the circuit is in the storage mode ($SCR_1$ closed), the polarity of the voltage on $C_2$ is reversed by closing the reversing switch $SCR_4$ to create a current oscillation with reversing coil $L_2$. The oscillation is arrested when the reversing switch $SCR_4$ opens at the next current zero, which leaves the counterpulse capacitor $C_2$ charged at the peak reversed voltage. The circuit has completed one full transfer cycle and is back to its original initial conditions (minus the energy transferred to the load $R_{LOAD}$ during the output pulse). Repetitive operation then requires repeating the transfer cycle just described.

Figure 2A:
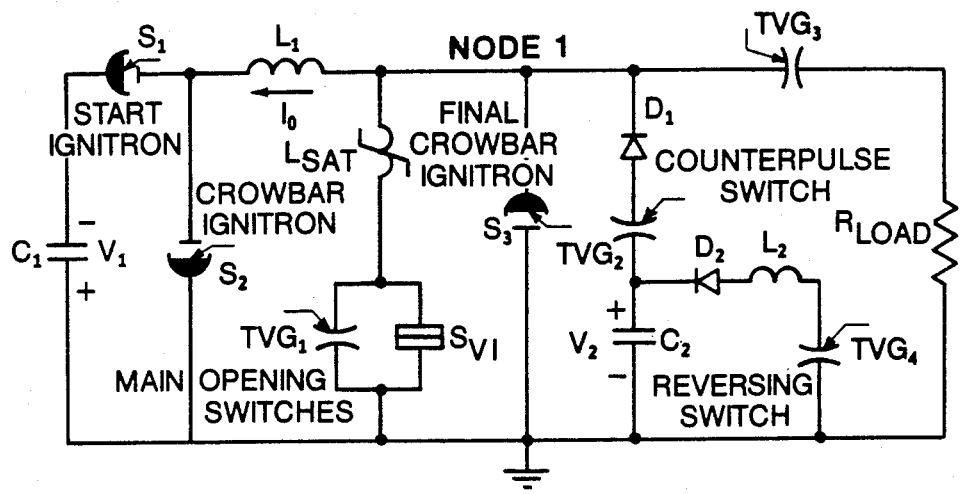
FIGS. 2A and 2B are circuit diagram of two embodiments of the present invention using TVG's for high-power operation.
Figure 2B:
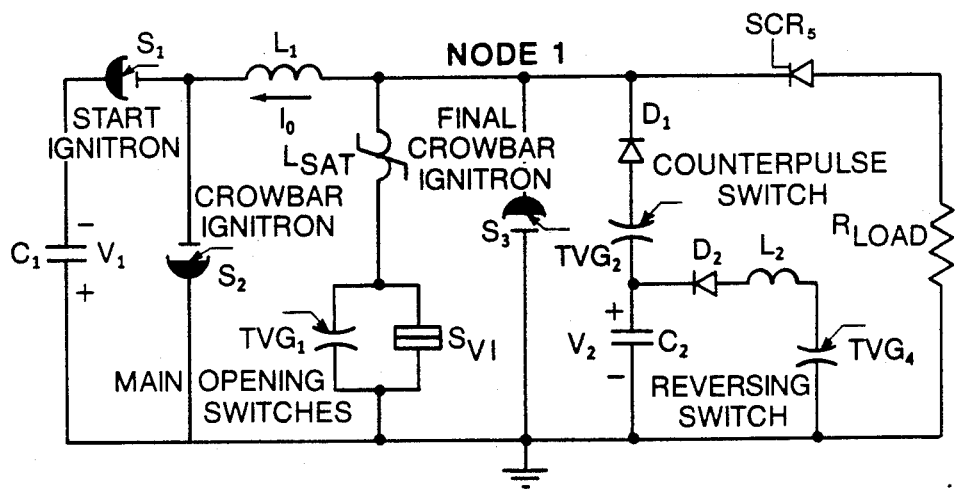

An embodiment of the present invention for high-power levels is shown in FIG. 2A. Preferably, switches $TVG_1$–$TVG_4$ are commercial triggered vacuum gaps, General Electric type ZR-7512 and EG&G type GPV-63. Switch $S_{VI}$ is a Westinghouse type W33089, type W32325B, or other suitable vacuum interrupters. Switches $S_1$, $S_2$, and $S_3$ are National type 5553B size D ignitrons, while diodes $D_1$ and $D_2$ are high powered solid state diodes. The energy storage capacitor bank $C_1$ consists of 96 capacitors, each rated at 15 $\mu$F and 20 kV, while the counter pulse capacitor bank $C_2$ consists of only 2 such capacitors. Saturable reactor $L_{SAT}$ is made up of 11 cores wound from 1-mm thick silicon steel tape and has a total flux rating of 0.08 Wb. Obviously, alternate components may be utilized at any location; see FIG. 2B. For example, switch $TVG_3$ may be replaced by $SCR_5$. Triggered vacuum gaps of the rod-array type may also be used if power ratings and cost justification permits.

Figure 3:
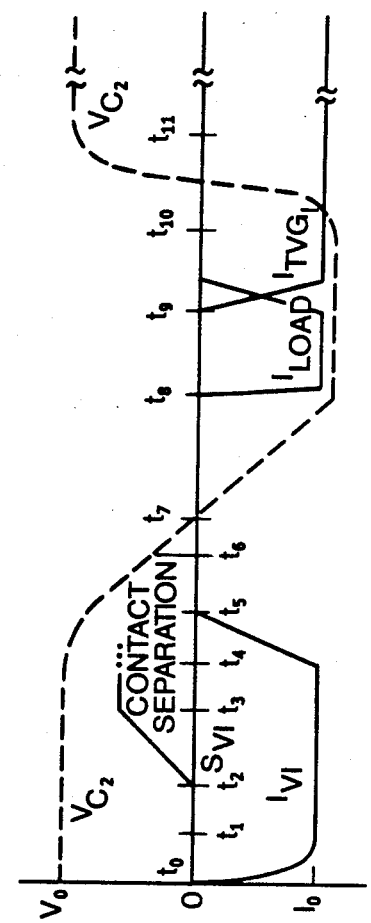
FIG. 3 is an illustration of typical waveforms derived from the circuit of FIG. 2A.
Figure 4:
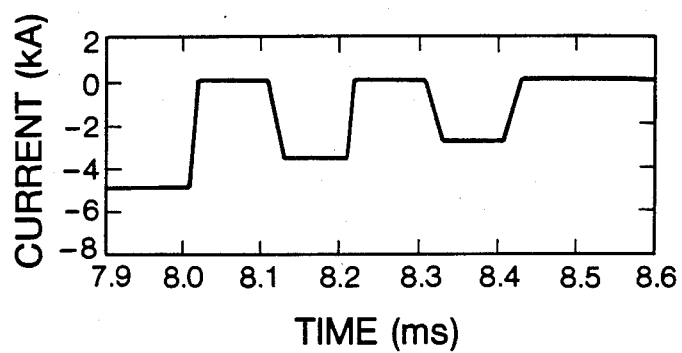
FIG. 4 illustrates the actual current waveform in the opening switches $S_{VI}$ and $TVG_1$ of the circuit of FIG. 2A.
Figure 5:
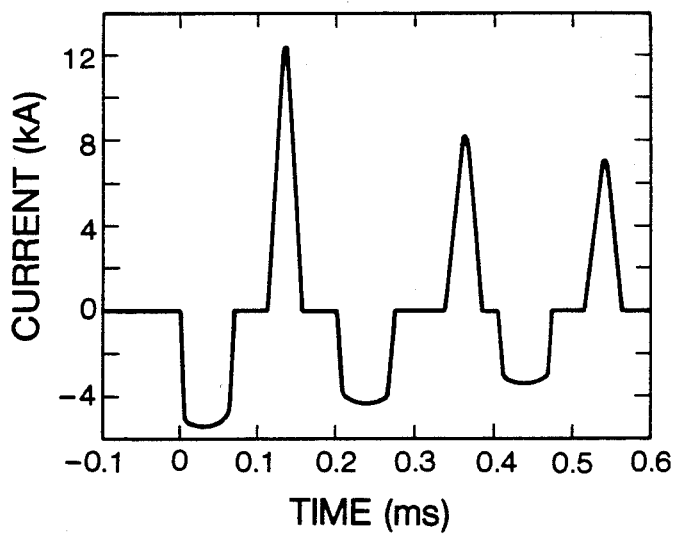
FIG. 5 illustrates the actual current in the counterpulse capacitor $C_2$ of the circuit of FIG. 2A.
Figure 6:
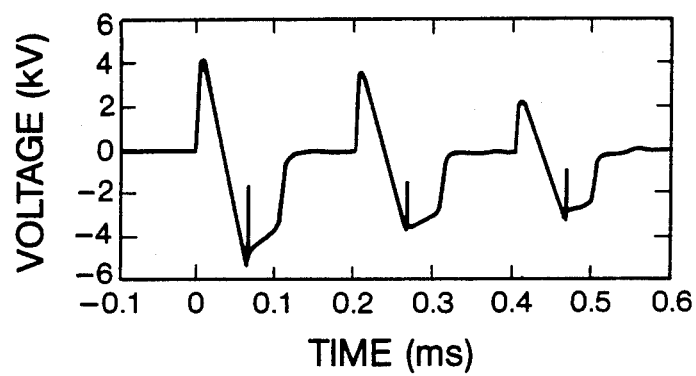
FIG. 6 illustrates the actual voltage waveform at node 1 in the circuit of FIG. 2A.
Figure 7:
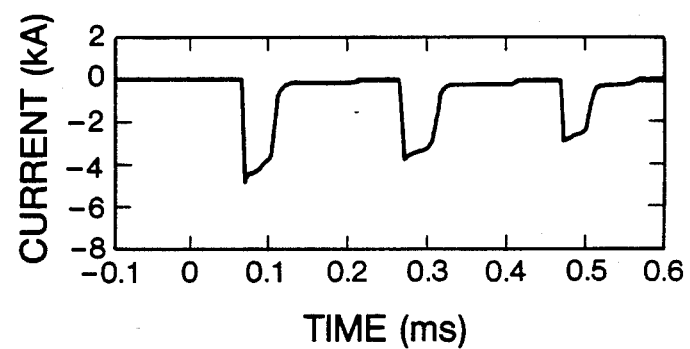
FIG. 7 illustrates the actual current waveform in the load $R_{LOAD}$ in the circuit of FIG. 2A.
Figure 8:
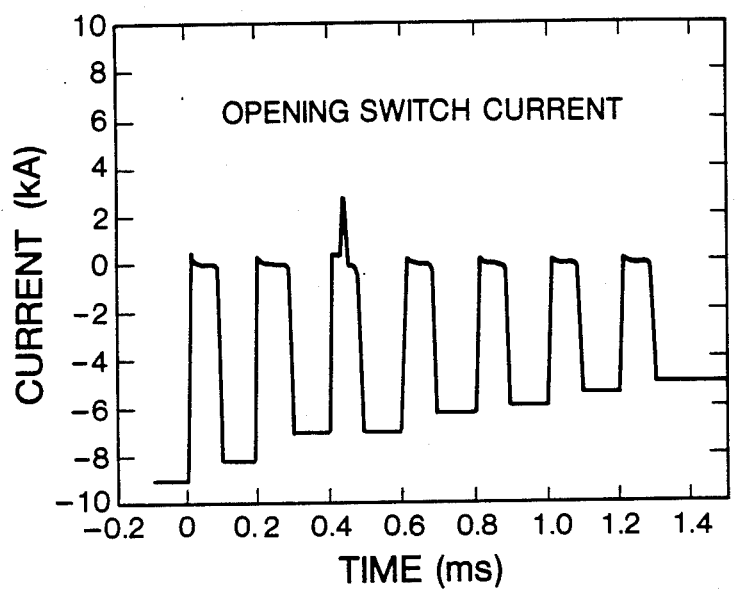
FIG. 8 illustrates the actual opening switch current for the circuit of FIG. 2A operating at 75 MW at 5 kpps pulse repetition rate.

The operation of the invention may be seen in FIGS. 3–8. FIG. 3 illustrates simplified waveforms for the circuit of FIG. 2A. At time $t_0$, the start switch $S_1$ is closed to discharge the 1.44-mF energy storage capacitor bank $C_1$ through the 180-$\mu$H energy storage inductor $L_1$ and the closed vacuum interrupter opening switch $S_{VI}$. At $t_1$, switch $S_2$ closes at peak current to trap the energy in $L_1$. The 5-kA current (FIG. 4) through $L_1$ and $S_{VI}$ then decays exponentially, depending upon $L_1$ and the total effective resistance of the storage loop. For the circuit described, the decay time constant is about 17 ms. At $t_2$, the contacts of $S_{VI}$ are mechanically parted to create a vacuum arc, a prerequisite for current-zero interruption later. The contacts of $S_{VI}$ are fully open by $t_3$, separated by a distance sufficient to withstand the eventual recovery voltage. At $t_4$, 8 ms from $t_0$, the precharged 30-$\mu$F counterpulse capacitor $C_2$ is discharged through $S_{VI}$ and saturable reactor $L_{SAT}$ (FIG. 5, negative part) to produce a current zero in $S_{VI}$ (FIG. 4). The time bases for the waveforms of FIGS. 5, 6, and 7 also begin at $t_4$. At $t_5$, $L_{SAT}$ comes out of saturation and introduces a large inductance into the counterpulse loop, "freezing" the current in $S_{VI}$ at a near-zero value for a time dependent on the volt-second rating of the reactor and the average voltage remaining on $C_2$. If the current-zero time ($t_7$–$t_5$) is long enough (about 2 $\mu$s), $S_{VI}$ deionizes and opens at $t_6$, stressed by an initial recovery voltage equal to the voltage remaining on $C_2$ at that time (FIG. 6, positive part). During the current-zero time and after $S_{VI}$ opens, the coil current is diverted from the opening switch into the counterpulse circuit, where it acts to reverse the polarity of $C_2$ (FIG. 6). At $t_8$, when $C_2$ has recharged to a voltage slightly greater than the expected load voltage, about 5 kV (FIG. 6), the load isolation switch $TVG_3$ is closed to initiate the output current pulse (FIG. 7) through the 1-$\Omega$ load resistor $R_{LOAD}$. The shape of the output current pulse is determined by two separate circuit actions that occur on different time scales. First, the load pulse risetime is determined by the discharge of $C_2$ through the load and depends on the circuit parameters $R_{LOAD}$, $C_2$, and the stray inductance in the discharge loop. The rising part of the load pulse terminates when the current through the counterpulse switch $TVG_2$ attempts to reverse directions, i.e., when the capacitor discharge current through the load equals the coil current $I_{L1}$ flowing through $D_1$, $TVG_2$, and $C_2$. The counterpulse switch and diode $D_1$ the clip the load pulse at the value $I_{L1}$, producing a fast-rising pulse with little overswing. The risetime of the load pulse can be decreased by increasing the voltage on $C_2$ by delaying the closing of $TVG_3$. This effect can be seen by the steeper risetime of the first load pulse versus the second load pulse (FIG. 7) resulting from the higher overcharge of the capacitor during its first recharge (FIG. 6) compared with its second recharge. Second, once $TVG_2$ opens to remove $C_2$ from the circuit, the flat part of the load pulse is determined by the discharge of the storage inductor $L_1$ directly though $R_{LOAD}$, causing the load pulse to decay with an exponential time constant of $\sim L_1/R_{LOAD}$. If the energy delivered during the load pulse is small compared with the total stored energy, the load current remains essentially constant. In this embodiment, the load pulse energy is a significant fraction of the stored energy and the load pulse decay is appreciable (FIG. 7), in other words, the pulse length is a sizeable fraction of the $L_1/R_{LOAD}$ time constant. At $t_9$, closing the triggered main opening switch $TVG_1$ terminates the load pulse (FIG. 7) and returns the system to the storage mode (FIG. 4) The load pulses are about 40 μs wide, having a 4-μs risetime (0–100%), and are spaced on a 200-μs interval, giving a pulse repetition rate of 5-kpps.

Before another transfer cycle can be initiated with a counterpulse operation, the polarity of $C_2$ must be reversed. This is accomplished by closing reversing switch $TVG_4$ at $t_{10}$ to discharge $C_2$ through the small 30-μH inductor $L_2$ and then interrupting the reversing current (FIG. 5 positive part) at $t_{11}$ at current zero and the peak reversed voltage. The complete cycle just described must then be repeated for each output pulse required. At the end of the pulse train, final crowbar switch $S_3$ is closed to carry the remainder of the current pulse.

Figure 9:
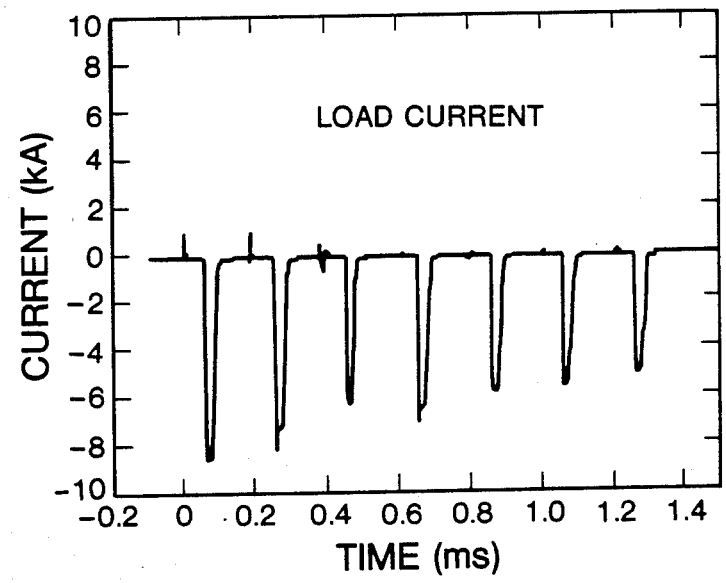
FIG. 9 illustrates the actual current in the load $R_{LOAD}$ of the circuit of FIG. 2A operating at 75 MW at 5 kpps pulse repetition rate.

The present invention may function at increased power levels. For example, to operate the circuit of FIG. 2 at 75 MW and a 5-kpps rate, the inductance of the storage coil $L_1$ is increased to 300 μH, increasing the decay time constant of the coil current to about 36 ms. By increasing the initial current in the storage coil to 9 kA and following the same procedures described above, a train of 7 pulses at a peak power of 75 MW can be delivered to the 1-Ω load at a 5-kpps rate, FIGS. 8 and 9. The first pulse reaches a peak current of 8.6 kA, while succeeding pulses have somewhat lower peak values due to transfer of energy from the storage inductor to the load. The pulses are 27 μs wide and have a risetime of 4 μs. A comparison of the total energy transferred to the load versus the decrease in stored energy during this pulse train indicated that the operational efficiency is 77% and could be 81% if the storage coil was lossless. Typical arc voltages are 45 V for $S_{V1}$ and 60 V for $TVG_1$. It should be emphasized that the opening switch achieves full interruption of the current and there is complete control (pulse-to-pulse) over load pulse initiation, duration, repetition rate and, to some extent, risetime. The system has some self-healing fault modes, including triggering failures of the counterpulse switch, the reversing switch, and the load isolation switch.

Even greater power handling may be achieved with the present invention by incorporating better opening switches. A current-zero type opening switch with excellent high-power, high-repetition-rate potential is the rod-array, triggered-vacuum-gap (RATVG) switch developed for the Electric Power Research Institute for use in high-voltage transmission lines, see J. A. Rich, C. P. Goody, and J. C. Sofianek, "High Power Triggered Vacuum Gap of Rod Array Type," General Electric Report No. 81CRD321, December 1981. The G1 tube described therein has been demonstrated capable of conducting an ac half-cycle current pulse of 150 kA (peak) and withstanding recovery voltage of 135 kV within 150 μs. This type of switch employed in the present invention would yield a repetitive-pulse circuit capable of operating in the 100-kA, 100-kV and 1-kpps range. Output pulses in the megampere or megavolt range could then be generated with an output pulse transformer. Operation as such would raise the repetitive-pulse power handling capability of the present invention to the 10-GW range.

The foregoing description of the preferred embodiments of the invention have been presented for purposes of illustration and description. It is not intended to be exhaustive or to limit the invention to the precise form disclosed, and obviously many modifications and variations are possible in light of the above teaching. As an example, the load is shown as resistive but could be capacitive or inductive as required for a particular application. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A reversing-counterpulse repetitive-pulse inductive storage circuit comprising:
    a. a dc voltage source having a positive and a negative output;
    b. a load having a first and a second end, said first end thereof connected to said positive output of said dc voltage source;
    c. a storage coil having a first and a second end, said first end thereof connected to said negative output of said dc voltage source;
    d. main opening unidirectional triggerable means connected between said second end of said storage coil and said positive output of said dc voltage source for initially being closed to permit the charging of the storage coil to fixed current level and for opening when current flowing through said main opening unidirectional triggerable means is reduced to zero;
    e. a counterpulse capacitor having a first and a second end, the first end thereof connected to the positive end of said dc voltage source, said counterpulse capacitor initially charged to a fixed voltage;
    f. counterpulse unidirectional triggerable means connected between said second end of said storage coil and said second end of said counterpulse capacitor for initiating a transfer cycle by closing thereby causing said counterpulse capacitor to discharge rapidly through said main opening unidirectional triggerable means so as to reduce current flow therethrough to zero and thereafter providing a current path for recharging said counterpulse capacitor by said storage coil and for opening when current flowing through said load reaches the level of current flowing through said storage coil;
    g. load isolation unidirectional triggerable means connected between said second end of said storage coil and said second end of said load for closing when said counterpulse capacitor has been recharged by said storage coil thereby initiating a current through said load which continues until terminated by reclosing said main opening unidirectional triggerable means;
    h. a reversing coil having a first and a second end, said first end thereof connected to said second end of said counterpulse capacitor; and
    i. reversing unidirectional triggerable means connected between said second end of said reversing coil and said positive end of said dc voltage source for closing after current has ceased flowing through said load and while said main opening unidirectional triggerable means is closed to reverse the charge on said counterpulse capacitor by a oscillation through said reversing coil and by opening when current therethrough goes through zero.

2. The circuit of claim 1 wherein at least one of said main opening unidirectional triggerable means, said counterpulse unidirectional triggerable means, said load isolation unidirectional triggerable means, and said reversing unidirectional triggerable means is a silicon controlled rectifier.

3. The circuit of claim 2 wherein at least one of said main opening unidirectional triggerable means, said counterpulse unidirectional triggerable means, said load isolation unidirectional triggerable means, and said reversing unidirectional triggerable means is a triggered vacuum gap switch.

4. The switch of claim 1 wherein at least one of said main opening unidirectional triggerable means, said counterpulse unidirectional triggerable means, said load isolation unidirectional triggerable means, and said reversing unidirectional triggerable means is a triggered vacuum gap switch.

5. A reversing-counterpulse repetitive-pulse inductive storage circuit comprising:
  a. a dc voltage source having a positive and a negative output;
  b. a load having a first and a second end, said first end thereof connected to said positive output of said DC voltage source;
  c. start unidirectional triggerable means having a first and a second end, said first end thereof connected to said negative output of said DC voltage source;
  d. a storage coil having a first and a second end, said first end thereof connected to said second end of said start unidirectional triggerable means;
  e. crowbar unidirectional triggerable means connected between said second end of said start unidirectional triggerable means and said positive output of said dc voltage source;
  f. a saturable reactor having a first and a second end, said first end thereof connected to said second end of said storage coil;
  g. main opening unidirectional triggerable means connected between said second end of said saturable reactor and said positive output of said dc voltage source;
  h. final crowbar unidirectional triggerable means connected between said second end of said storage coil and said positive output of said dc voltage source;
  i. a counterpulse capacitor having a first and a second end, the first end thereof connected to the positive end of said dc voltage source, said counterpulse capacitor initially charged to a fixed voltage;
  j. counterpulse unidirectional triggerable means having a first end and a second end, said first end thereof connected to said second end of said counterpulse capacitor;
  k. a first unidirectional device connected between said second end of said storage coil and said second end of said second end of said counterpulse unidirectional triggerable means;
  l. load isolation unidirectional triggerable means connected between said second end of said load and said second end of said storage coil;
  m. a second unidirectional device having a first end and a second end, said first end thereof connected to said second end of said counterpulse capacitor;
  n. a reversing coil having a first and a second end, said first end thereof connected to said second end of said second unidirectional device; and
  o. reversing unidirectional triggerable means connected between said second end of said reversing coil and said positive end of said dc voltage source.

6. The circuit of claim 5 wherein at least one of said main opening unidirectional triggerable means, said counterpulse unidirectional triggerable means, said load isolation unidirectional triggerable means, and said reversing unidirectional triggerable means is a silicon controlled rectifier.

7. The circuit of claim 6 wherein at least one of said main opening unidirectional triggerable means, said counterpulse unidirectional triggerable means, said load isolation unidirectional triggerable means, and said reversing unidirectional triggerable means is a triggered vacuum gap switch.

8. The circuit of claim 5 wherein at least one of said main opening unidirectional triggerable means, said counterpulse unidirectional triggerable means, said load isolation unidirectional triggerable means, and said reversing unidirectional triggerable means is a triggered vacuum gap switch.

* * * * *